United States Patent
Yi et al.

(10) Patent No.: US 9,232,680 B2
(45) Date of Patent: Jan. 5, 2016

(54) FRAME STRUCTURE FOR PREVENTING DEFORMATION, AND ELECTRONIC DEVICE INCLUDING THE SAME

(71) Applicant: Samsung Electronics Co., Ltd., Suwon-si, Gyeonggi-do (KR)

(72) Inventors: Sang-Hyun Yi, Ansan-si (KR); Byoung-Uk Yoon, Hwaseong-si (KR); Ho-Eun Hwang, Yongin-si (KR); Jae-Woo Lee, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 191 days.

(21) Appl. No.: 14/104,521

(22) Filed: Dec. 12, 2013

(65) Prior Publication Data

US 2014/0198464 A1 Jul. 17, 2014

(30) Foreign Application Priority Data

Jan. 14, 2013 (KR) ........................ 10-2013-0003950

(51) Int. Cl.
*H05K 5/02* (2006.01)
*H05K 7/18* (2006.01)
*H04M 1/18* (2006.01)
*H05K 1/02* (2006.01)
*H05K 5/00* (2006.01)
*H04M 1/02* (2006.01)

(52) U.S. Cl.
CPC ................. *H05K 7/18* (2013.01); *H04M 1/185* (2013.01); *H05K 1/0281* (2013.01); *H05K 5/0004* (2013.01); *H04M 1/0277* (2013.01)

(58) Field of Classification Search
CPC .. H04M 1/0277; H04M 1/185; H05K 1/0281; H05K 5/0004; H05K 7/18

USPC .................................. 361/729, 757, 829, 813
See application file for complete search history.

(56) References Cited

U.S. PATENT DOCUMENTS

| | | | |
|---|---|---|---|
| 5,251,849 A | 10/1993 | Torres | |
| 6,058,293 A | 5/2000 | Phillips | |
| 7,383,029 B2 | 6/2008 | Sasaki et al. | |
| 7,832,565 B2 * | 11/2010 | Sasaki ................. | H01M 2/1038 206/703 |
| 8,446,740 B2 * | 5/2013 | Yoshida ................ | H04M 1/185 361/737 |
| 2005/0285991 A1 | 12/2005 | Yamazaki | |
| 2008/0094787 A1 | 4/2008 | Kabeya | |
| 2010/0075719 A1 | 3/2010 | Tomioka et al. | |
| 2011/0128677 A1 | 6/2011 | Lu et al. | |
| 2012/0034957 A1 | 2/2012 | Kim et al. | |
| 2013/0016486 A1 * | 1/2013 | Allore ................... | H04M 1/026 361/753 |

(Continued)

FOREIGN PATENT DOCUMENTS

| | | |
|---|---|---|
| JP | 2004-080391 A | 3/2004 |
| JP | 2006-011163 A | 1/2006 |
| JP | 2007-537503 A | 12/2007 |
| JP | 2008-288972 A | 11/2008 |
| JP | 2010-055361 A | 3/2010 |

(Continued)

*Primary Examiner* — Yuriy Semenenko
(74) *Attorney, Agent, or Firm* — Jefferson IP Law, LLP (57) ABSTRACT

An electronic device is provided. The electronic device includes a main frame, an opening portion formed in the main frame, a recess portion formed along a frame of the opening portion lower than a surface of the main frame, and a plate having frames seated on the recess portion, wherein at least one of the frames of the plate is formed of a curved portion that is curved inwardly. Accordingly, it is possible to absorb an external impact and prevent deformation just by a simple structure change of the plate.

20 Claims, 9 Drawing Sheets

(56) References Cited

U.S. PATENT DOCUMENTS

2013/0217444 A1\* 8/2013 Lee .................... H04M 1/0249
 455/566
2015/0043141 A1\* 2/2015 Pegg .................... H04M 1/026
 361/679.26

FOREIGN PATENT DOCUMENTS

| JP | 2010-081125 A | 4/2010 |
|----|---------------|--------|
| JP | 2011-097414 A | 5/2011 |
| KR | 1990-0021674 A | 12/1990 |

\* cited by examiner

FRAME STRUCTURE FOR PREVENTING DEFORMATION, AND ELECTRONIC DEVICE INCLUDING THE SAME

CROSS-REFERENCE TO RELATED APPLICATION(S)

This application claims the benefit under 35 U.S.C. §119(a) of a Korean patent application filed on Jan. 14, 2013 in the Korean Intellectual Property Office and assigned Serial No. 10-2013-0003950, the entire disclosure of which is hereby incorporated by reference.

TECHNICAL FIELD

The present disclosure relates to a method and apparatus using a frame structure. More particularly, the present disclosure relates to a frame structure for preventing deformation, and an electronic device including the same.

BACKGROUND

Recently, while electronic devices become multifunctional, electronic devices with better portability have higher competitiveness. For example, users prefer electronic devices that are slimmer, lighter and smaller while having the same functions. Therefore, electronic device manufacturers are competing to develop electronic devices that are slimmer, lighter and smaller while having the same or better functions. In addition, the electronic device manufacturers are making an effort to develop electronic devices that are slimmer and have higher durability.

As part of the effort, while the external appearance and internal frames of electronic devices have been formed of plastic material, plastic frames are replaced with metal frames that are stronger than the plastic frames. This is because the metal frame may be formed thinner than the plastic frame, and the metal frame has higher durability than the plastic frame, while they have the same thickness. Also, by using a metal material (e.g., aluminum, Stainless Steel (STS), or Steel Use Stainless (SUS)) that is as light as a plastic material, the drawbacks of the metal material against the plastic material are gradually remedied.

In recent electronic devices, a frame or a portion of the external appearance of an internal main frame, which is die-cast and is formed of a metal material (e.g. mainly magnesium), is insert-molded with a plastic material. Thus, by using an internal metal frames formed of the metal material, components of devices, such as Liquid Crystal Display (LCD) modules and battery packs, may be securely supported and may securely withstand an external impact.

However, such a metal main frame should have a predetermined thickness satisfying a minimum injection thickness, which hinders the slimness of electronic devices.

The above information is presented as background information only to assist with an understanding of the present disclosure. No determination has been made, and no assertion is made, as to whether any of the above might be applicable as prior art with regard to the present disclosure.

SUMMARY

Aspects of the present disclosure are to address at least the above problems and/or disadvantages and to provide at least the advantages described below. Accordingly, an aspect of the present disclosure is to provide a frame structure for preventing deformation, which may securely withstand an external impact, and an electronic device including the same.

Another aspect of the present disclosure is to provide a frame structure for preventing deformation, which may prevent plastic deformation caused by an external impact just by a simple structure change of a thin plate, and an electronic device including the same.

Another aspect of the present disclosure is to provide a frame structure for preventing deformation, which may ensure device reliability by preventing deformation caused by an external impact, and an electronic device including the same.

In accordance with another aspect of the present disclosure, an electronic device includes a main frame, an opening portion formed in the main frame, a recess portion formed along a frame of the opening portion lower than a surface of the main frame, and a plate having frames seated on the recess portion, wherein at least one of the frames of the plate is formed of a curved portion that is curved inwardly.

In accordance with another aspect of the present disclosure, an electronic device may include a main frame including an opening portion, and a plate that is installed at the main frame to close the opening portion of the main frame and includes one or more straight frame sections along frames thereof. Herein, the main frame may include a recess portion that is formed along a frame of the opening portion lower than a surface of the main frame, and has a predetermined width. The plate may be installed such that the frames of the plate are seated on the recess portion of the main frame. Herein, at least one of the straight frame sections may be formed of a curved portion that is curved inwardly.

In accordance with another aspect of the present disclosure, except the curved portion, the frames of the plate may be supported by a structure such as ribs that are installed at or around a stepped portion formed by the recess portion and the surface of the main frame. In this case, the main frame may include at least one coupling portion, and a spacing distance of the curved portion to the structure such as the ribs installed at or around the stepped portion may increase as a spacing distance of the curved portion to the at least one coupling portion increases. Also, the curved portion may have a curvature within a rage of the recess portion.

According to various embodiments, the plate may be formed of at least one of a metal material, a composite material, a plastic material, and an inorganic material such as glass. For example, the thin plate may be formed of any one of Glass Fiber Reinforced Plastics (GFRP), Carbon Fiber Reinforced Plastics (CFRP), aluminum, and Steel Use Stainless (SUS).

Other aspects, advantages, and salient features of the disclosure will become apparent to those skilled in the art from the following detailed description, which, taken in conjunction with the annexed drawings, discloses various embodiments of the present disclosure.

BRIEF DESCRIPTION OF THE DRAWINGS

The above and other aspects, features, and advantages of certain embodiments of the present disclosure will be more apparent from the following description taken in conjunction with the accompanying drawings, in which.

Throughout the drawings, it should be noted that like reference numbers are used to depict the same or similar elements, features, and structures.

DETAILED DESCRIPTION

The following description with reference to the accompanying drawings is provided to assist in a comprehensive understanding of various embodiments of the present disclosure as defined by the claims and their equivalents. It includes various specific details to assist in that understanding but these are to be regarded as merely exemplary. Accordingly, those of ordinary skill in the art will recognize that various changes and modifications of the embodiments described herein can be made without departing from the scope and spirit of the present disclosure. In addition, descriptions of well-known functions and constructions may be omitted for clarity and conciseness.

The terms and words used in the following description and claims are not limited to the bibliographical meanings, but, are merely used by the inventor to enable a clear and consistent understanding of the present disclosure. Accordingly, it should be apparent to those skilled in the art that the following description of various embodiments of the present disclosure is provided for illustration purpose only and not for the purpose of limiting the present disclosure as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

In describing the present disclosure, a mobile communication terminal including a touchscreen device is illustrated and described as an electronic device; however, the present disclosure is not limited thereto. Examples of the electronic device may include Personal Digital Assistants (PDAs), laptop computers, smart phones, netbooks, Mobile Internet Devices (MID), Ultra Mobile Personal Computers (UMPCs), tablet Personal Computers (PCs), navigation devices, and digital audio players.

Also, the present disclosure may be applicable to various devices having an assembly structure in which a thinner frame among two frames of the present disclosure is assembled to the other frame among two frames. This assembly structure may also be applicable to devices other than electronic devices.

Figure 1:
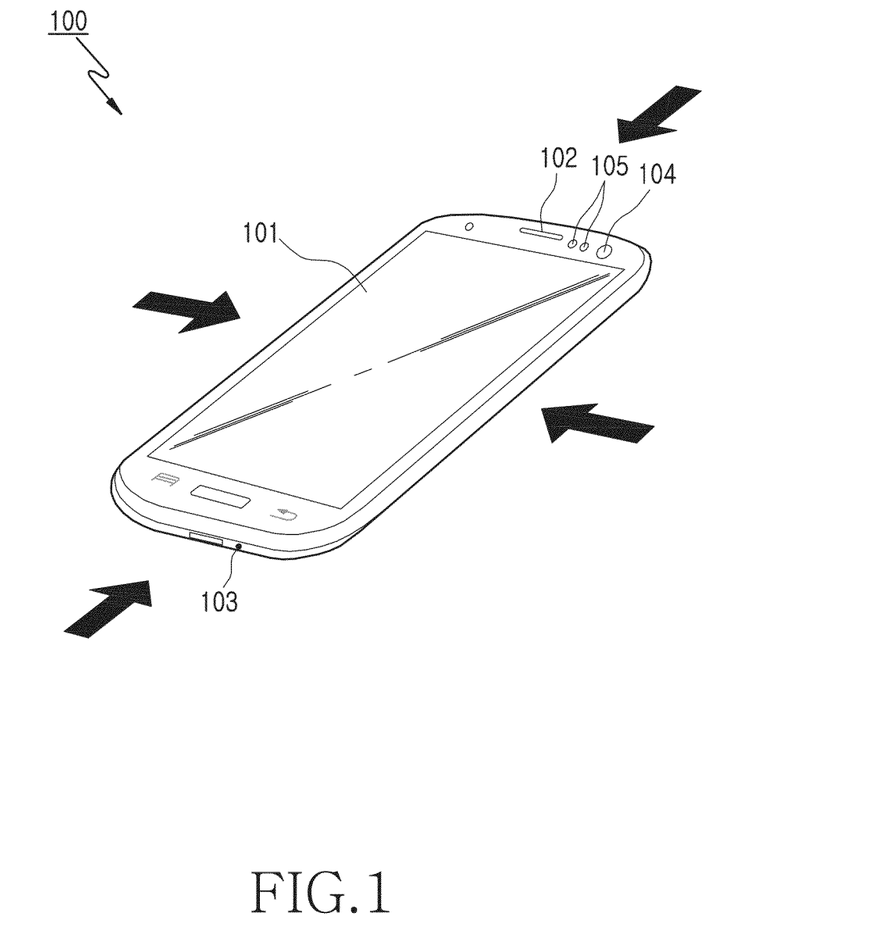
FIG. 1 is a perspective view of an electronic device according to an embodiment of the present disclosure.

FIG. 1 is a perspective view of an electronic device as a mobile communication terminal according to an embodiment of the present disclosure.

Referring to FIG. 1, a display device 101 is installed at a front side of the electronic device 100, a speaker device 102 for receiving a voice of a counterpart is installed over the display device 101, and a microphone device 103 for transmitting a voice of a user of the electronic device 100 to the counterpart is installed under the electronic device 101, thereby performing a basic communication function. Although not illustrated, a high-definition Liquid Crystal Display (LCD) module may be used as the display device 101, and a touch panel may be added as a data input unit.

Also, sensors 105 for operating the electronic device 100 adaptively according to surrounding environments are included, and a camera lens assembly 104 for object photographing is installed.

According to an embodiment of the present disclosure, a main frame is installed inside the electronic device 100, and a thin plate is installed at an opening portion formed in the main frame, which will be described further below. In this case, a curved portion, which is curved inwardly, may be formed at a straight frame section of the thin plate to absorb an external impact, which is applied in the direction of at least one of the arrows of FIG. 1, thereby preventing plastic deformation thereof.

A structure of the thin plate will be described below in further detail.

Figure 2:
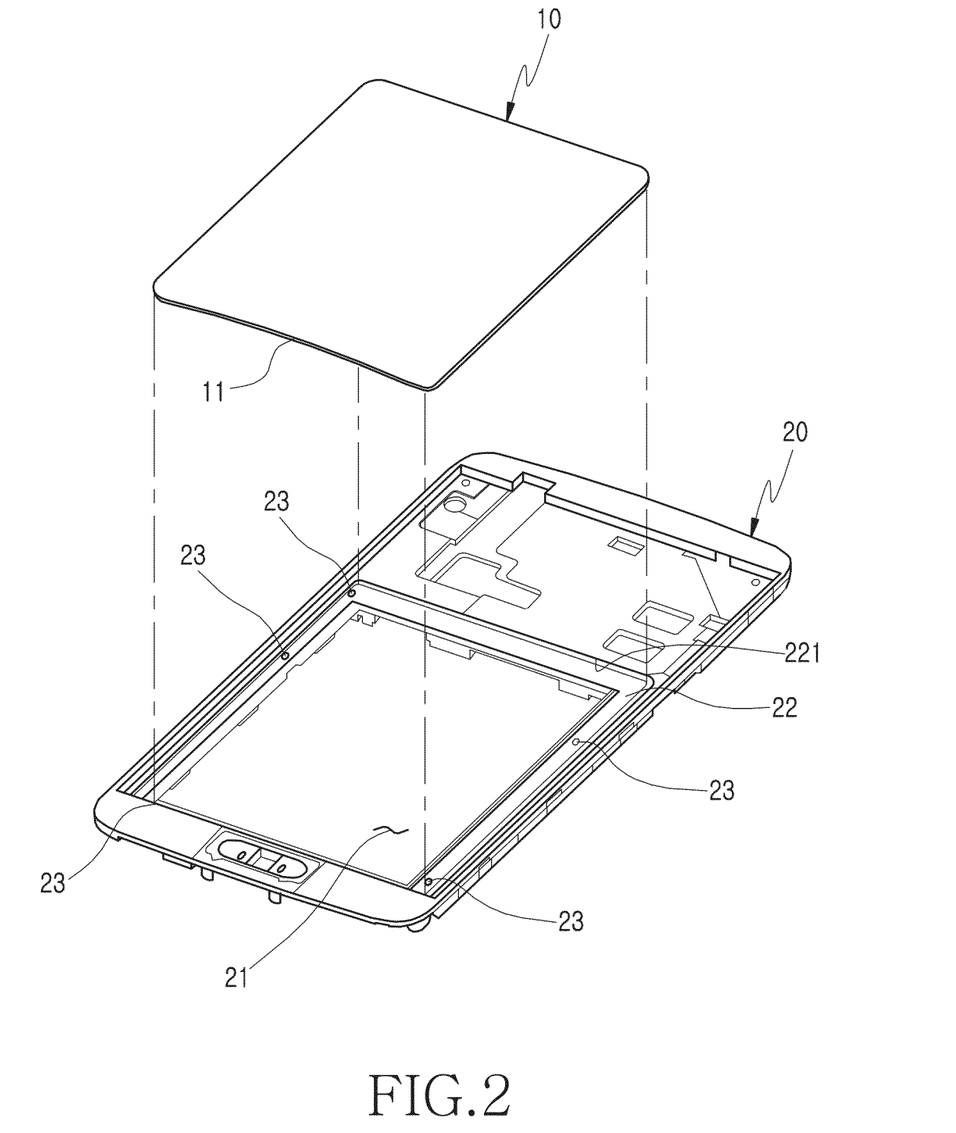
FIG. 2 is an exploded perspective view illustrating a state of connecting a thin plate to a main frame according to an embodiment of the present disclosure.

FIG. 2 is an exploded perspective view illustrating a state of connecting a thin plate to a main frame according to an embodiment of the present disclosure.

Figure 3:
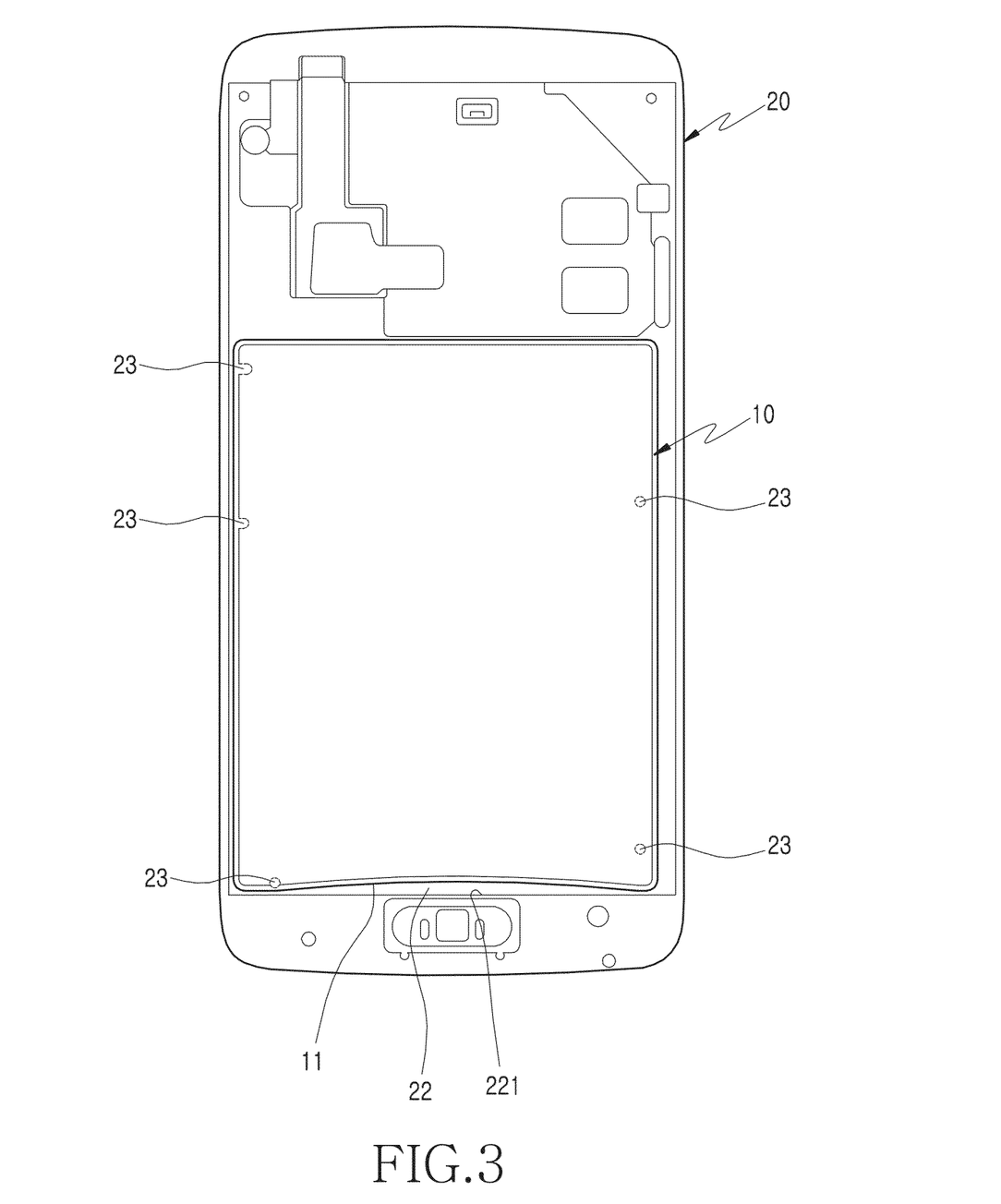
FIG. 3 is a plan view illustrating a state in which a thin plate is connected to a main frame according to an embodiment of the present disclosure.

FIG. 3 is a plan view illustrating a state in which a thin plate is connected to a main frame according to an embodiment of the present disclosure.

Figure 5:
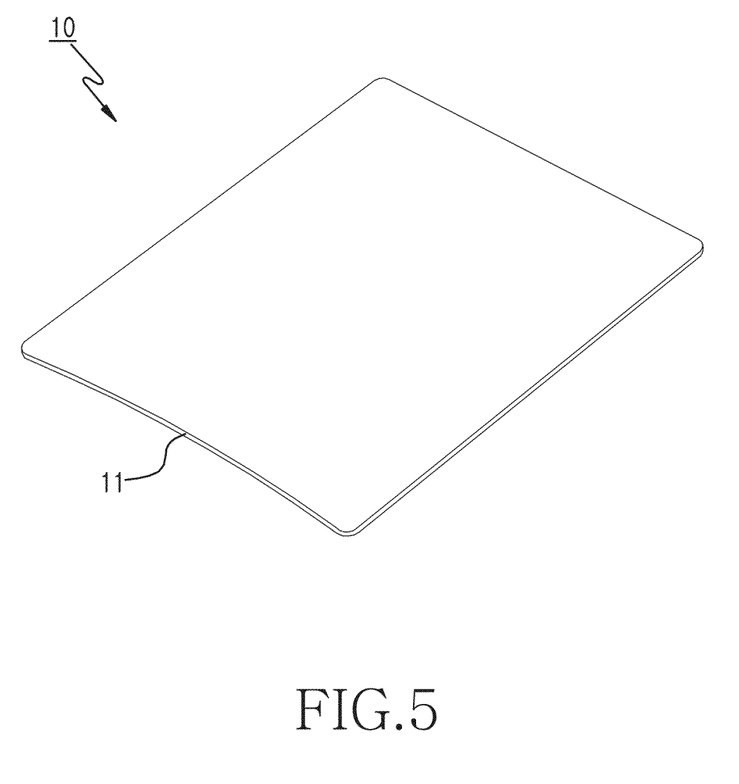
FIG. 5 is a detailed view illustrating a thin plate as a single product according to an embodiment of the present disclosure.

FIG. 5 is a detailed view illustrating a thin plate as a single product according to an embodiment of the present disclosure.

Figure 4:
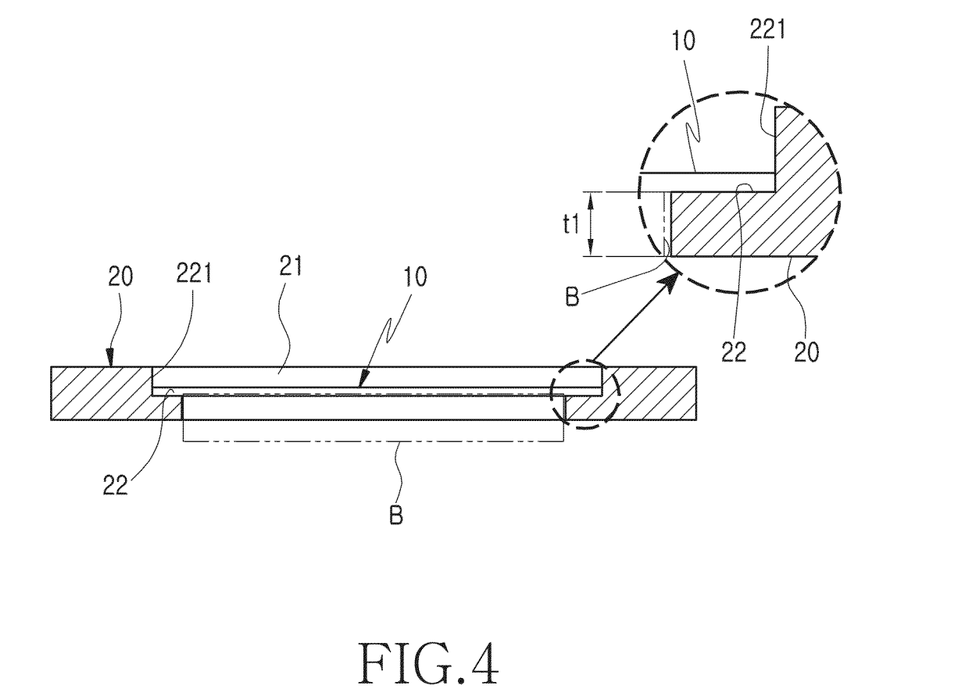
FIG. 4 is an enlarged cross-sectional view illustrating a state in which a thin plate is connected to a main frame according to an embodiment of the present disclosure.

Referring to FIGS. 2 and 3, an opening portion 21 of a predetermined size is formed at a main frame 20, and a thin plate 10 is assembled to the opening portion 21 to close the opening portion 21. As illustrated in FIG. 4, the opening portion 21 may be used as a space for installing a battery pack B, and a space corresponding to the subtraction of the thickness of the thin plate 10 from the thickness of the main frame 20 may be used as an installation space for the battery pack B.

For example, the main frame 20 may be formed of a magnesium casting through a die-casting process. Although not illustrated, an LCD module used as a display device of the electronic device 100 may be mounted on the main frame 20. However, the present disclosure is not limited thereto, and the main frame 20 may be formed of metal such as aluminum capable of die-casting or mechanical processing, or an injectable polymer compound material such as Poly Carbonate (PC).

Also, the thin plate 10 may be formed of a metal material that has a relatively minute thickness and hardness. Examples of the metal material may include aluminum and Steel Use Stainless (SUS). The thin plate 10 may also be formed of a composite material such as Glass Fiber Reinforced Plastics (GFRP) or Carbon Fiber Reinforced Plastics (CFRP) that has a hardness similar or equal to that of metal. In addition, the thin plate 10 may be formed of an inorganic material such as glass, or a polymer compound material such as PC.

At the opening portion 21 of the main frame 20, along an inner frame thereof, a recess portion 22 having a predetermined width is formed lower than the surface of the main frame 20. Accordingly, a stepped portion 221 will be naturally formed at the boundary between the recess portion 22 and the surface of the main frame 20. Therefore, a predetermined region of the frame of the thin plate 10 surface-contacts the recess portion 22 formed at the opening portion 21 of the main frame 20, and is seated and connected by being supported or guided by the stepped portion 221. In this case, the thin plate 10 and the main frame 20 may be fixed to each other by an adhesive material such as a double-sided adhesive tape or bonding. The stepped portion 221 may also be formed by a mechanism structure such as various ribs formed around the inner frame of the opening portion 21, as well as the recess portion 22.

FIGS. 2 and 3 illustrate a case where a rectangular thin plate 10 is applied to a rectangular opening portion 21 of the main frame 20; however, the present disclosure is not limited thereto. For example, the thin plate 10 may be formed in various shapes according to the opening shapes of the main frame 20.

According to an embodiment of the present disclosure, as illustrated in FIG. 5, the thin plate 10 includes at least a straight frame section, and the straight frame section has a curved portion 11 that is curved inwardly. Both ends of the straight frame section of the thin plate 10 may contact the stepped portion 221 formed at the opening portion 21 of the main frame 20, and the curved portion 11 may be spaced apart from the stepped portion 221. That is, the curved portion 11 may have a curvature that is curved from one end of the straight frame section of the thin plate 10, at which a straight line starts, to the other end at which the straight line ends. However, while being spaced apart from the stepped portion 221, the curved portion 11 may be limited within a range that does not deviate from the recess portion 22.

A plurality of coupling portions 23 may be formed at the main frame 20. The coupling portions 23 may be screw holes at which the main frame 20 is assembled by screws to a coupling region such as a boss disposed at a predetermined position of another frame that forms the external appearance of the electronic device 100. The coupling portions 23 are formed near the opening portion 21 to provide durability for supporting the thin plate 10 applied to the opening portion 21.

Therefore, obviously, when the thin plate 10 is assembled to close the opening portion 21 of the main frame 20, when an external impact is applied to the electronic device 100, the thin plate 10 is affected by the external impact most greatly at a portion that is spaced far away from the coupling portions 23 of the main frame 20. Therefore, the curved portion 11 of the thin plate 10 may be formed to have the maximum spacing distance from the stepped portion 221 of the main frame 20 at a portion spaced farthest away from the coupling portions 23, thereby absorbing and dispersing the external impact and preventing plastic deformation caused by a secondary shock.

FIG. 4 is an enlarged cross-sectional view illustrating a state in which a thin plate is connected to a main frame according to an embodiment of the present disclosure.

Referring to FIG. 4, the thin plate 10 is installed to close the opening portion 21 of the main frame 20. The thin plate 10 is installed such that a predetermined area of region of the frame of the thin plate 10 is seated at the recess portion 22 formed at the opening portion 21 of the main frame 20. Therefore, the thin plate 10 is installed such that at least a portion of the frame of the thin plate 10 contacts and is supported by the stepped portion 221 formed by the recess portion 22. Thus, it is possible to obtain a space of a thickness t1 corresponding to the subtraction of the thickness of the thin plate 10 from the thickness of the opening portion 21 of the main frame 20. In the electronic device 100, the space formed by the thickness t1 will be used as a space for installing the battery pack B.

Figure 6:
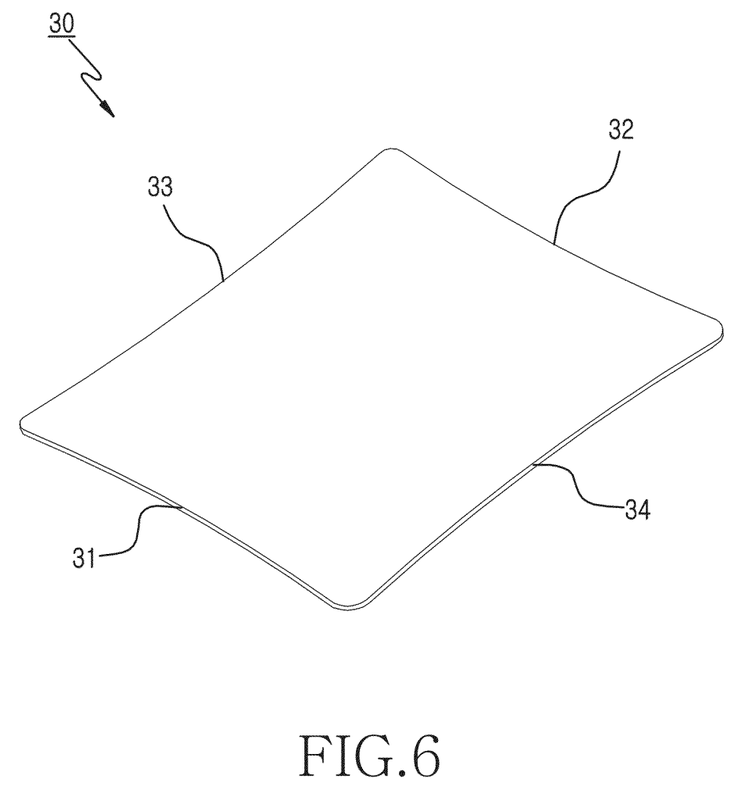
FIG. 6 is a perspective view of a thin plate according to another embodiment of the present disclosure.

FIG. 6 is a perspective view of a thin plate according to another embodiment of the present disclosure.

Figure 7:
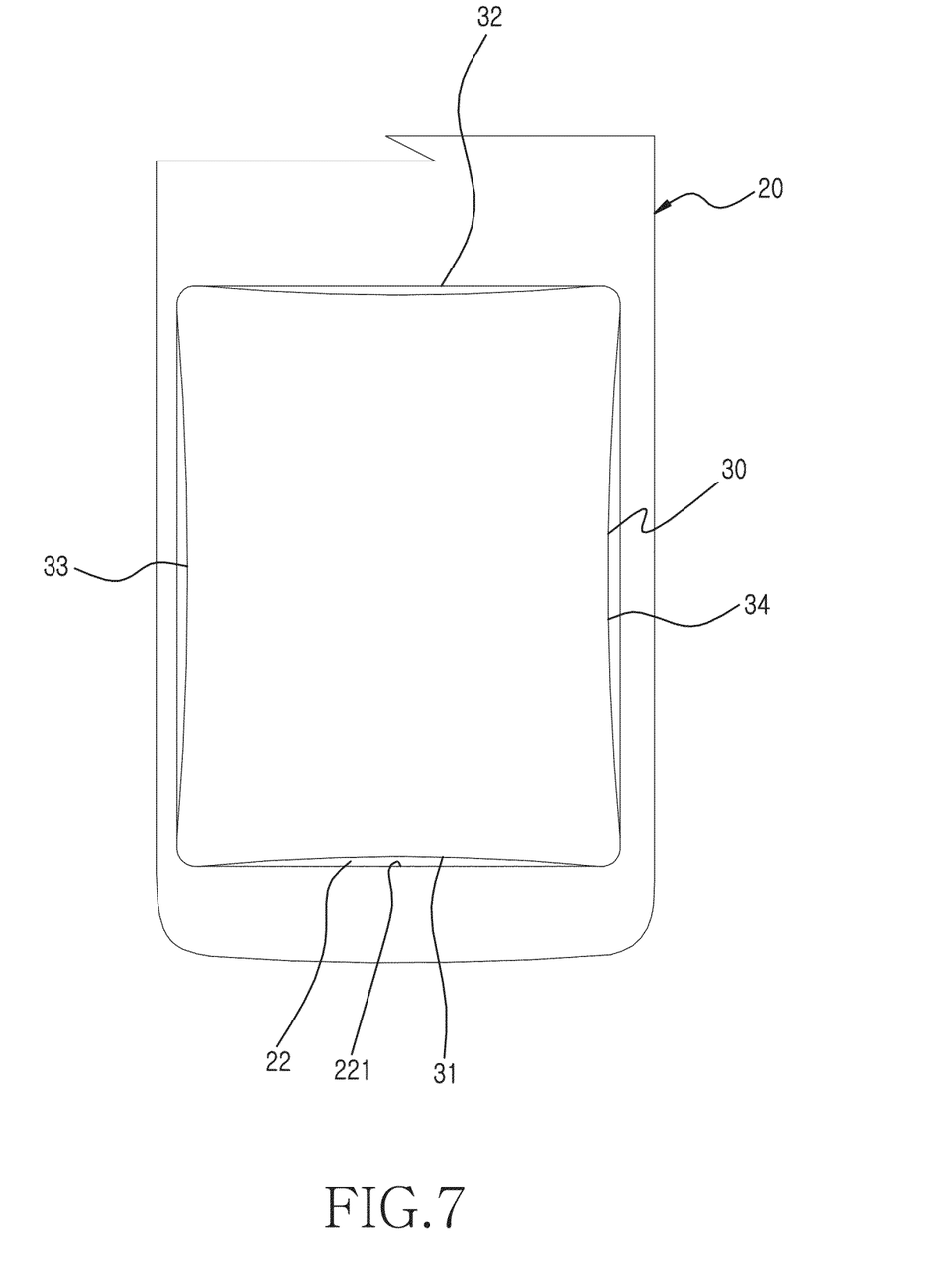
FIG. 7 is a plan view illustrating a state in which the thin plate of FIG. 6 is connected to a main frame according to another embodiment of the present disclosure.

FIG. 7 is a plan view illustrating a state in which the thin plate of FIG. 6 is connected to a main frame according to another embodiment of the present disclosure.

According to the present disclosure described above, the curved portion 11 that is curved inwardly is formed in the straight frame section of the thin plate 10 such that it does not contact and has the maximum spacing distance from the stepped portion 221 formed at the opening portion 21 of the main frame 20 with respect to the portion (maximum deformation position) that is spaced farthest away from the coupling portions 23 of the main frame 20, thereby absorbing or dispersing the external impact.

Referring to FIGS. 6 and 7, in this embodiment, a curved portion is formed at all of four frames of a thin plate 30. That is, in the above configuration, curved portions 31, 32, 33 and 34 formed at the frames of the thin plate 30 are configured to disperse an impact that is received from under the electronic device 100. However, in this configuration, it is more advantageous to prevent the plastic deformation of the thin plate 30 by dispersing all of at least one impact received on at least one of four portions of the electronic device 100 as illustrated in FIG. 1.

Therefore, as illustrated in FIGS. 6 and 7, first, second, third and fourth curved portions 31, 32, 33 and 34 are formed at the thin plate 30, and the thin plate 30 may be assembled such that portions, at which the respective curved portions 31, 32, 33 and 34 meet each other, contact the stepped portion 221 formed at the opening portion 21 of the main frame 20.

Figure 8:
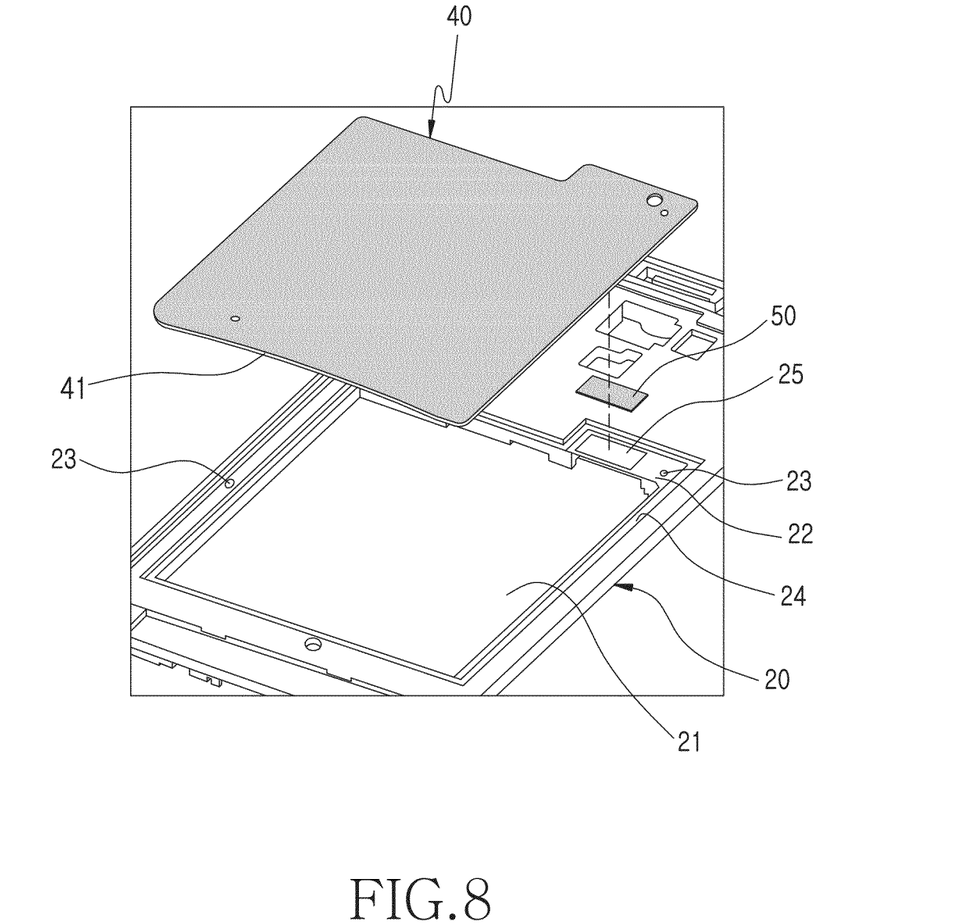
FIG. 8 is an exploded perspective view illustrating a state of connecting a thin plate to a main frame according to another embodiment of the present disclosure.

FIG. 8 is an exploded perspective view illustrating a state of connecting a thin plate to a main frame according to another embodiment of the present disclosure.

Figure 9:
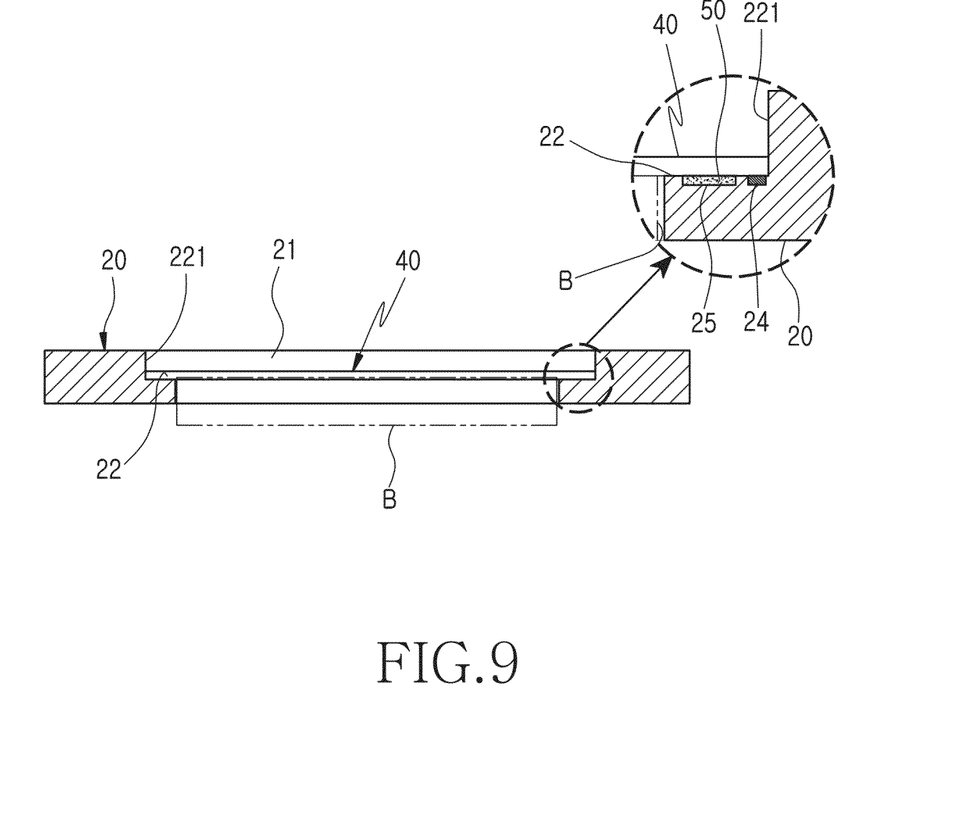
FIG. 9 is an enlarged cross-sectional view illustrating a state in which the thin plate of FIG. 8 is connected to a main frame according to another embodiment of the present disclosure.

FIG. 9 is an enlarged cross-sectional view illustrating a state in which the thin plate of FIG. 8 is connected to a main frame according to another embodiment of the present disclosure.

FIGS. 8 and 9 illustrate the connection relation between a metal thin plate 40 and a metal main frame 20. According to an embodiment of the present disclosure, as illustrated in FIG. 8, the thin plate 40 includes at least a straight frame section, and the straight frame section has a curved portion 41 that is curved inwardly. In this case, a bond seating surface 24 may be formed along the recess portion 22 around the opening portion 21 of the main frame 20. Therefore, the thin plate 40 is installed such that at least a portion of the frame of the thin plate 40 contacts and is supported by the stepped portion 221 formed by the recess portion 22. In addition, a conductive tape seating surface 25 for seating a conductive tape 50 thereon may be formed at the recess portion 22. For electrical contact with the conductive tape 50 seated on the conductive tape seating surface 25, a conductive tape contact region of the thin plate 40 may have various shapes such as finger, emboss, and hole.

A plurality of coupling portions 23 may be formed at the main frame 20. The coupling portions 23 may be screw holes at which the main frame 20 is assembled by screws to a coupling region such as a boss disposed at a predetermined position of another frame that forms the external appearance of the electronic device 100. The coupling portions 23 are formed near the opening portion 21 to provide durability for supporting the thin plate 40 applied to the opening portion 21.

However, while the thin plate 40 and the main frame 20 are described above as being formed out of metal, at least one of the thin plate 40 and the main frame 20 may be formed of a nonmetal. Although metal connection is general technology in the art, the connection of metal and nonmetal or the connection of nonmetal and nonmetal may also be used. In order to make the nonmetal conductive, a conductive coating such as an ElectroMagnetic Interference (EMI) coating or a deposition may be used.

Also, various shapes such as a finger, an emboss, and a hole may be applied to a contact region of the conductive tape used as a conductive member 50; however, this may obstruct contact stability. Therefore, in this design, various shapes such as a finger, an emboss, and a hole may be applied to a case where the area and the shape is difficult to apply the tape, a case where performance implementation is unstable when the tape is applied, or a case when reduction of the cost or the number of processes is required. Thus, simultaneous separate application thereto is not necessarily excluded. However, in an embodiment, only the tape may be applied, or various shapes such as a finger, an emboss, and a hole may be added to a portion, at which application of the tape is difficult, to promote the contact.

Therefore, as illustrated in FIG. 9, the thin plate 40 is fixed to the main frame 20 by an adhesive bond applied to the bond seating surface 24 of the main frame 20, and the conductive tape 50 is interposed between the thin plate 40 and the main frame 20. That is, the thin plate 40 and the main frame 20 are electrically connected to each other. In this case, for example, when the thin plate 40 and the main frame 20 are applied to a mobile communication terminal, a ground expansion effect of an antenna radiator may be promoted to increase a bandwidth or to improve the radiation characteristics of the antenna radiator.

The conductive tape 50 is used as a conductive member for electrically connecting the thin plate 40 and the main frame 20; however, the present disclosure is not limited thereto. For example, when space permits, other conductive members may be used instead of the conductive tape 50. An example of the conductive members may include various known conductive materials such as a conductive adhesive bond, a conductive clip, a Flexible Printed Circuit Board (FPCB), and fine cable.

The thin plate assembly structure according to the embodiments of the present disclosure may absorb the external impact and prevent the plastic deformation just by a simple structure change of the thin plate, thus improving the device reliability.

It will be apparent that there are various methods that may modify the above embodiments while falling within the scope of the following claims. That is, there may be various methods that may implement the present disclosure without departing from the scope of the following claims.

For example, the curved portions according to the embodiments of the present disclosure are formed throughout the straight frame section of the thin plate. However, the present disclosure is not limited thereto, and the curved portions of the thin plate according to the embodiments of the present disclosure may be formed at a portion of the straight frame section of the thin plate. For example, in order to ensure the durability of the thin plate, the curved portions may be formed at the respective sections while the portion spaced farthest away from the portion coupled by screws is set to the maximum deformation position.

While the disclosure has been shown and described with reference to certain embodiments thereof, it will be understood by those skilled in the art that various changes in form and details may be made therein without departing from the spirit and scope of the disclosure as defined by the appended claims and their equivalents.

What is claimed is:

1. An electronic device comprising:
   a main frame;
   an opening portion formed in the main frame;
   a recess portion formed along a frame of the opening portion lower than a surface of the main frame; and
   a plate having frames seated on the recess portion, wherein at least one of the frames of the plate is formed of a curved portion that is curved inwardly.

2. The electronic device of claim 1, wherein, except for the curved portion, the frames of the plate are supported by a stepped portion formed by the recess portion and the surface of the main frame.

3. The electronic device of claim 2, wherein the main frame includes at least one coupling portion, and a spacing distance from the curved portion to the stepped portion increases as a distance to the at least one coupling portion increases.

4. The electronic device of claim 1, wherein the curved portion has a curvature within a range of the recess portion.

5. The electronic device of claim 1, wherein the plate is formed of at least one of a metal material, a composite material, a polymer compound, an inorganic material, Glass Fiber Reinforced Plastics (GFRP), Carbon Fiber Reinforced Plastics (CFRP), aluminum, and Steel Use Stainless (SUS).

6. The electronic device of claim 1, wherein the main frame is formed of at least one of a metal capable of die-casting or mechanical processing by magnesium or aluminum, and an injectable polymer compound.

7. The electronic device of claim 1, wherein the plate is fixed to the main frame by bonding or double-sided adhesion.

8. The electronic device of claim 1, wherein the main frame and the plate are formed of a conductive material, and
   wherein a conductive member is further interposed between the main frame and the plate to electrically connect the main frame and the plate.

9. The electronic device of claim 8, wherein the conductive member includes at least one of a conductive tape, a conductive adhesive bond, a conductive clip, a Flexible Printed Circuit Board (FPCB), and a cable.

10. The electronic device of claim 1, wherein the electronic device is a mobile communication terminal.

11. A frame structure of a device, the frame structure comprising:
    a main frame;
    an opening portion formed in the main frame;
    a recess portion formed along a frame of the opening portion lower than a surface of the main frame; and
    a plate disposed to close the opening portion,
    wherein frames of the plate are seated on the recess portion, and at least one of the frames of the plate is formed of a curved portion that is curved inwardly.

12. The frame structure of claim 11, wherein, except for the curved portion, the frames of the plate are supported by a stepped portion formed by the recess portion and the surface of the main frame.

13. The frame structure of claim 12, wherein the main frame includes at least one coupling portion, and a spacing distance from the curved portion to the stepped portion increases as a distance to the at least one coupling portion increases.

14. The frame structure of claim 11, wherein the curved portion has a curvature within a range of the recess portion.

15. The frame structure of claim 11, wherein the plate is formed of at least one of a metal material, a composite material, a polymer compound, an inorganic material, Glass Fiber Reinforced Plastics (GFRP) Carbon Fiber Reinforced Plastics (CFRP), aluminum, and Steel Use Stainless (SUS).

16. The frame structure of claim 11, wherein the frames of the plate are fixed to the recess portion of the main frame by bonding or double-sided adhesion.

17. The frame structure of claim 11, wherein the frame is implemented for an electronic device.

18. The frame structure of claim 11, wherein the device is a mobile communication terminal.

19. An electronic device comprising:
   a main frame;
   an opening portion formed in the main frame;
   a recess portion formed along a frame of the opening portion lower than a surface of the main frame;
   a plate having frames seated on the recess portion, wherein at least one of the frames is formed of a curved portion that is curved inwardly; and
   a conductive member seated on the recess portion between the plate and the main frame.

20. The electronic device of claim 19, wherein the conductive member includes at least one of a conductive tape, a conductive adhesive bond, a conductive clip, a Flexible Printed Circuit Board (FPCB), and a cable.

* * * * *